United States Patent
Tzeng et al.

(10) Patent No.: US 11,618,670 B2
(45) Date of Patent: Apr. 4, 2023

(54) SENSOR WITH CHAMBER

(71) Applicant: AI Nose Corporation, New Taipei (TW)

(72) Inventors: Yu-Fen Tzeng, Miaoli County (TW);
Chia-Pin Huang, Miaoli County (TW);
Yu-Hsuan Liao, Miaoli County (TW);
Chun-Hsien Tsai, Miaoli County (TW);
Ting-Chuan Lee, Miaoli County (TW);
Chun-Jung Tsai, Miaoli County (TW)

(73) Assignee: AINOS, INC, San Diego, CA (US)

( * ) Notice: Subject to any disclaimer, the term of this patent is extended or adjusted under 35 U.S.C. 154(b) by 187 days.

(21) Appl. No.: 17/225,844

(22) Filed: Apr. 8, 2021

(65) Prior Publication Data
US 2021/0316985 A1 Oct. 14, 2021

(30) Foreign Application Priority Data
Apr. 9, 2020 (TW) ................. 109112039

(51) Int. Cl.
*B81B 7/00* (2006.01)
*G01D 11/24* (2006.01)

(52) U.S. Cl.
CPC .......... *B81B 7/0038* (2013.01); *G01D 11/245* (2013.01); *B81B 2203/0315* (2013.01)

(58) Field of Classification Search
CPC .......... B81B 7/0038; B81B 2203/0315; G01D 11/245; G10K 11/004; G01N 29/222; H01L 23/13
See application file for complete search history.

(56) References Cited

U.S. PATENT DOCUMENTS

| | | | | |
|---|---|---|---|---|
| 5,523,564 A | * | 6/1996 | Yamada | H01L 37/02 250/370.15 |
| 9,804,046 B2 | | 10/2017 | Kwa | |
| 2006/0281231 A1 | * | 12/2006 | Senba | H01L 23/564 257/E23.189 |
| 2019/0336099 A1 | | 11/2019 | Fife | |
| 2020/0223686 A1 | * | 7/2020 | Vummidi Murali | B81B 7/0029 |
| 2020/0270122 A1 | * | 8/2020 | Shelton | B06B 1/0677 |

* cited by examiner

*Primary Examiner* — Francis C Gray

(74) *Attorney, Agent, or Firm* — Muncy, Geissler, Olds & Lowe, P.C.

(57) ABSTRACT

A sensor with a chamber comprises a base, a cavity body, a sensing element, and a porous gel material. The cavity body is disposed on the base and has a cavity wall and an inner space formed inside the cavity wall, the sensing element is disposed on the cavity wall, and the porous gel material is disposed between the base and the cavity body, the porous gel material has a porosity of not less than 80%, so that gas is capable of communicating between the inner space of the cavity body and an outside, thereby forming a passage for gas to enter and exit to balance a pressure in the sensor with the chamber, increase a support of the sensor with the chamber, and reduce the risk of conventional bonding between the sensing element and the base using die-bonding adhesive.

12 Claims, 3 Drawing Sheets

SENSOR WITH CHAMBER

FIELD OF THE INVENTION

The invention relates to a sensor, and more particularly to a sensor provided with a porous gel material and having a chamber.

BACKGROUND OF THE INVENTION

Sensors generally refer to components that output signals according to physical, chemical or environmental changes, such as resistive sensors, piezoelectric sensors, pyroelectric sensors, electrochemical sensors, and microwave sensors. In the aforementioned sensors, some sensors need to form a cavity structure based on the consideration of sensing principle.

As disclosed in the U.S. Pat. No. 9,804,046, a pressure sensor comprises a cavity formed by a molding material, a control die disposed in the cavity, and a pressure transducer die disposed on the control die, the control die and the pressure transducer die are connected to each other through a wire bonding, and then the dies are adhered on a carrier baseplate through dispensing an adhesive.

The U.S Patent Publication No. US2019/0336099A1 discloses an ultrasonic device comprising an ultrasonic transducer and an inlet hole, the ultrasonic transducer comprises a base and a membrane, wherein the base and the membrane are disposed with a sealed cavity formed between the base and the membrane, the inlet hole penetrates the membrane, and the inlet hole is configured as a passage for entering into the sealed cavity.

For the above-mentioned sensor or transducer provided with a cavity structure, an adhesive is usually used to fix the cavity structure on the carrier baseplate for subsequent packaging processes. In practice, the adhesive is usually a die-bonding adhesive. However, when the adhesive is used for fixing, the cavity structure is likely to be sealed due to too many glue spots being formed by the adhesive, which will easily cause the sensor to be damaged during the operation; on the other hand, if too few glue spots are formed by the adhesive, it will easily cause the joint surfaces to fall off.

SUMMARY OF THE INVENTION

A main object of the invention is to solve the problem that conventional sensors with a cavity are easily damaged or fall off easily due to the use of adhesive.

In order to achieve the above-mentioned object, the invention provides a sensor with a chamber comprising a base, a cavity body, a sensing element, and a porous gel material. The cavity body is disposed on the base and includes a cavity wall and an inner space formed therein, the sensing element is disposed on the cavity wall, and the porous gel material is disposed between the base and the cavity body, a porosity of the porous gel material is not less than 80%, so that gas is capable of communicating between the inner space of the cavity body and an outside.

In order to achieve the above-mentioned object, the invention further provides a sensor with a chamber comprising a base, a cavity body, a sensing element, and a porous gel material. The cavity body is disposed on the base and includes a cavity wall and an inner space formed therein, the sensing element is disposed on a top wall of the cavity body, and the porous gel material is partially disposed in the inner space. Furthermore, the porous gel material includes a first surface covered by the cavity wall without exposing to an outside and a second surface exposed to the outside without covering by the cavity wall, wherein a porosity of the porous gel material is not less than 80%, so that gas is capable of communicating between the inner space of the cavity body and the outside through the second surface.

The invention integrates the porous gel material into the sensor, and the porous gel material serves as a passage for gas communicating with the outside. Since gas is capable of entering and exiting between the inner space and the outside, an air pressure between the inner space and the outside can be balanced, and glue spots of an adhesive can be thoroughly set, and the integrity of sensing function can still be met without sacrificing a degree of bonding. In addition, the cavity body can be filled with the porous gel material, so that the cavity body is supportive and not easily damaged, and heat loss in the inner space can be reduced.

DETAILED DESCRIPTION OF THE PREFERRED EMBODIMENTS

The detailed description and technical contents of the invention are described below with reference to the drawings.

Figure 1:
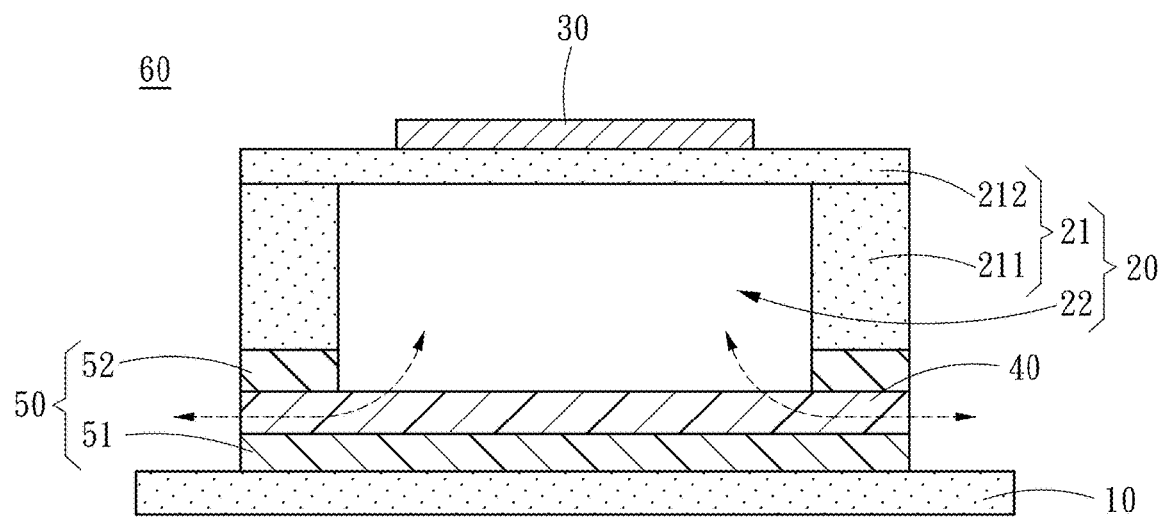
FIG. 1 is a structural cross-sectional view of a first mode of a first embodiment of the invention.

Please refer to FIG. 1, the invention provides a sensor with a chamber, which comprises a base 10, a cavity body 20, a sensing element 30, a porous gel material 40, and an attach layer 50. In the invention, the sensor with the chamber can be any sensor with a chamber structure. According to different usage requirements, the sensor with the chamber can be selected as a temperature sensor, a gas sensor, a pressure sensor, a tire pressure gauge, or a microphone. In the invention, a material of the base 10 can be metal, glass, ceramic, polymer, or composite materials thereof. For example, the base 10 can be silicon wafer, plastic, printed circuit board (PCB), fiberglass plate, silicon dioxide, or photoresist.

The cavity body 20 is disposed on the base 10. The cavity body 20 comprises a cavity wall 21 and an inner space 22, the inner space 22 is formed inside the cavity wall 21. The cavity wall 21 comprises a side wall 211 and a top wall 212 disposed thereon, and the sensing element 30 is disposed on the top wall 212. In this embodiment, the side wall 211 is made of a silicon material, and the top wall 212 is made of an insulating material. The porous gel material 40 is disposed between the base 10 and the cavity body 20. The porous gel material 40 includes a specific surface area between 500 $m^2/g$ and 1200 $m^2/g$, and a porosity greater than 80%. In one embodiment, the porosity is between 88% and 99.8%, the porous gel material 40 includes a density between 0.01 $g/cm^3$ and 0.2 $g/cm^3$, and a thermal conductivity value lower than 0.035 W/m-K. The porous gel material 40 can be a silicon-based material or a hydrophobic material, wherein the silicon-based material is selected from a group consisting of silicon-based compounds such as siloxane compounds, water glass and sodium silicate, for example, the porous gel material 40 comprises a silicon-based compound and an additive mixed with the silicon-based compound. The additive is selected from a group consisting of single-layer carbon nanotubes, multilayer carbon nanotubes, multilayer graphene, and combinations thereof. Thereby, gas can easily pass through the inner space 22 of the cavity body 20 by using the porosity of the porous gel material 40, and flow in and out between the inner space 22 and an outside 60 in order to balance an air pressure inside the sensor with the chamber.

The attach layer 50 comprises a first attach layer 51 and a second attach layer 52. The first attach layer 51 is attached between the porous gel material 40 and the base 10, the second attach layer 52 is attached between the cavity body 20 and the porous gel material 40, and the porous gel material 40 and the attach layer 50 can be different structures such as the shape of the layer or the shape of the ring, respectively. Wherein the attach layer 50 is selected from adhesive tape, adhesive film, wafer attach film, die attach film, FOD (Fingerprint On Display) film, FOW (Film Over Wire) film, die-bonding adhesive, or other adhering materials.

Figure 2:
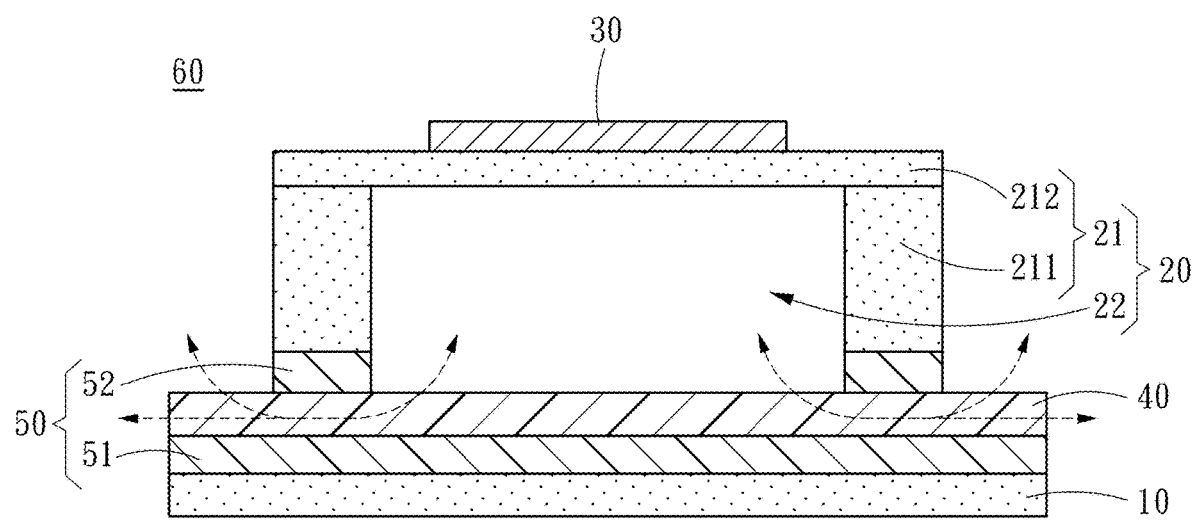
FIG. 2 is a structural cross-sectional view of a second mode of the first embodiment of the invention.
Figure 3:
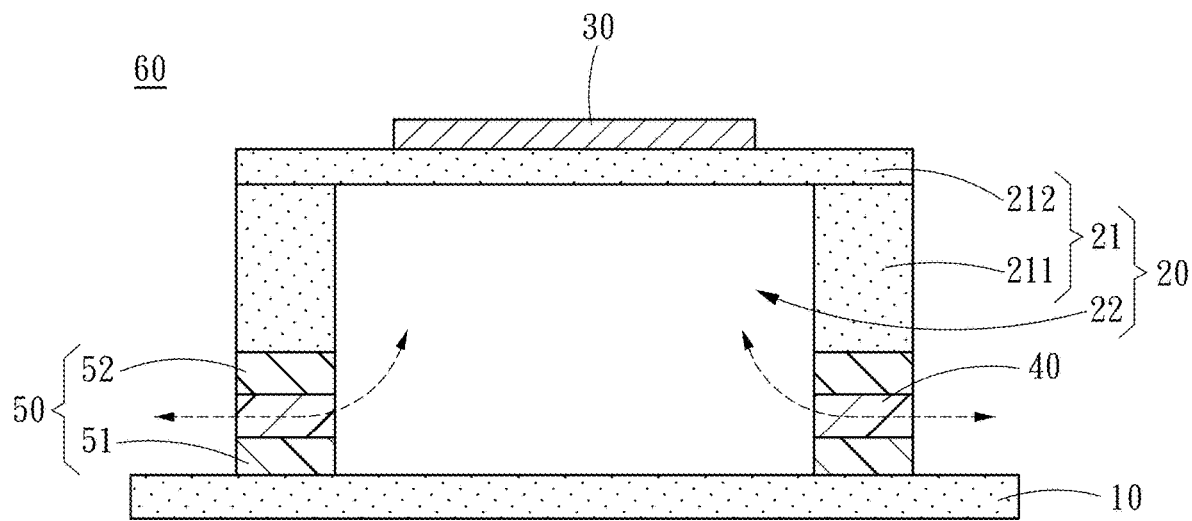
FIG. 3 is a structural cross-sectional view of a third mode of the first embodiment of the invention.
Figure 4:
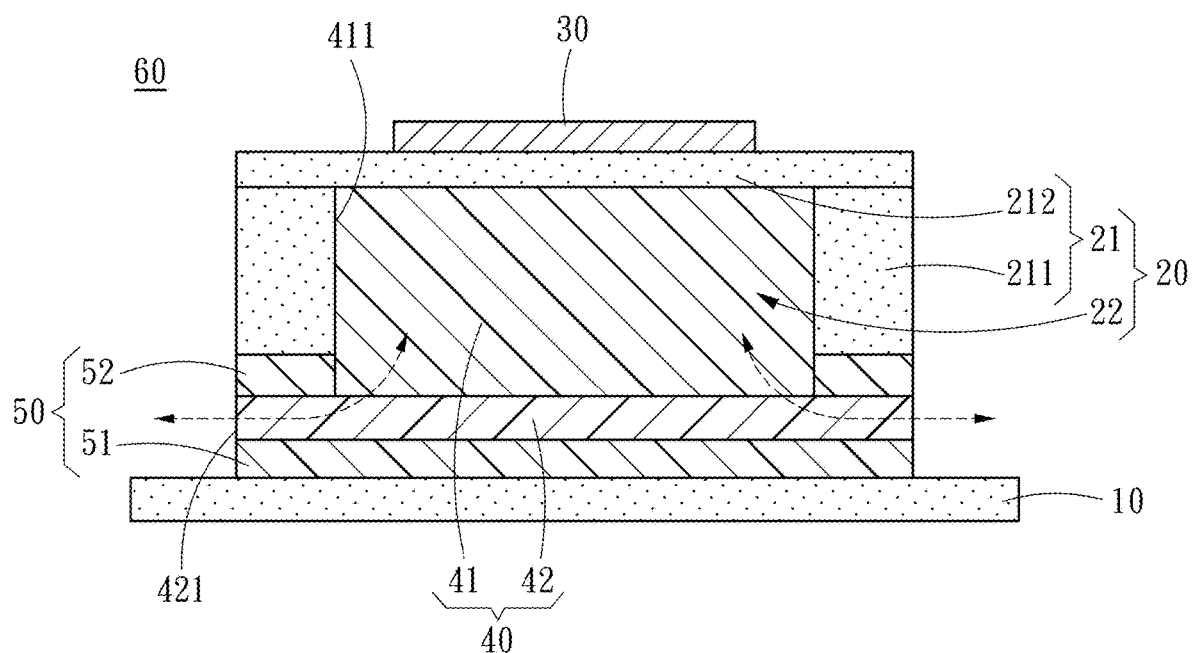
FIG. 4 is a structural cross-sectional view of a first mode of a second embodiment of the invention.
Figure 5:
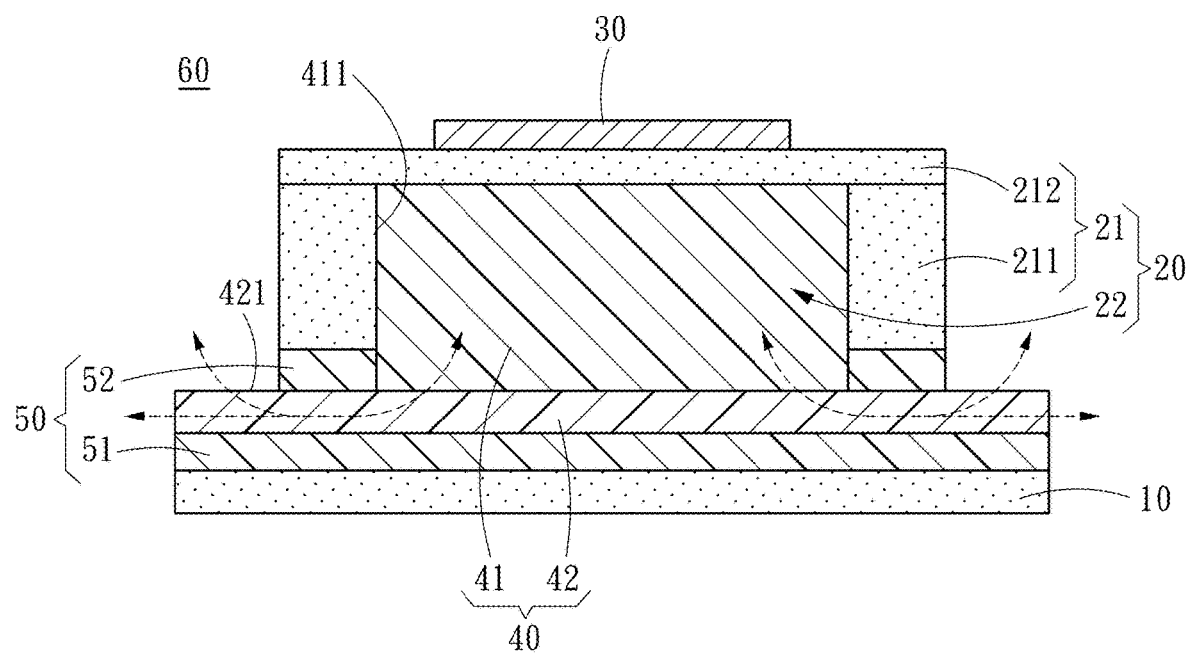
FIG. 5 is a structural cross-sectional view of a second mode of the second embodiment of the invention.
Figure 6:
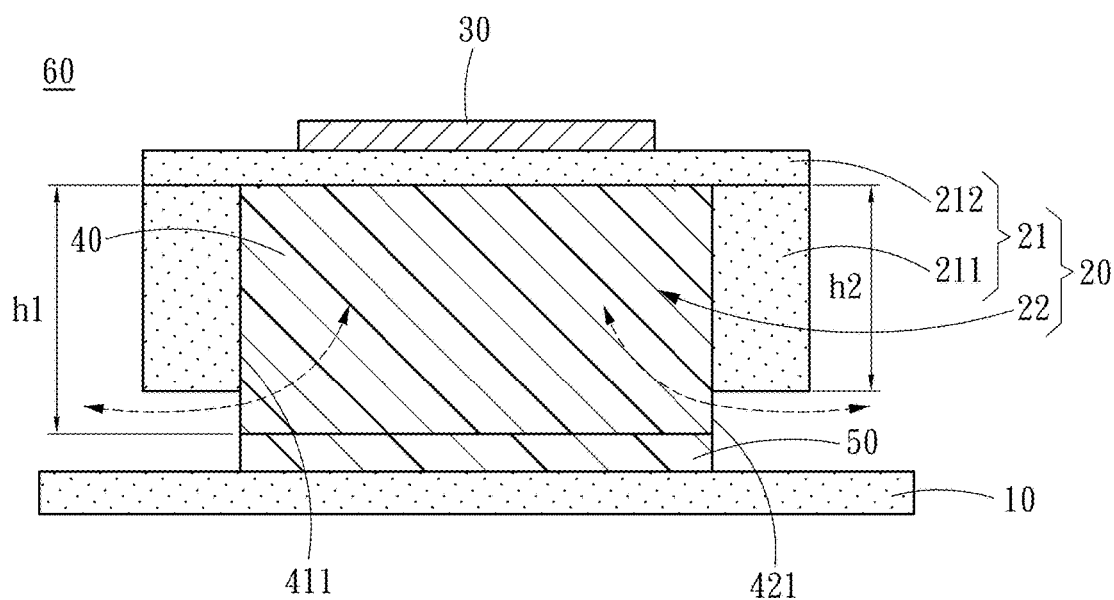
FIG. 6 is a structural cross-sectional view of a third mode of the second embodiment of the invention.

FIG. 1, FIG. 2 and FIG. 3 are different aspects of a first embodiment of the invention, respectively; and FIG. 4, FIG. 5 and FIG. 6 are different aspects of a second embodiment of the invention, respectively.

As shown in FIG. 1, in a first mode of the first embodiment of the invention, the porous gel material 40 is into a shape of a layer or a sheet, and the layer extends from one side to the other side of the side wall 211 of the cavity body 20; the first attach layer 51 is into a shape of a layer or a sheet, and the layer extends from one side to the other side of the side wall 211 of the cavity body 20, in other words, two-dimensional geometric shapes of the porous gel material 40 and the first attach layer 51 correspond to each other on the XY plane; the second attach layer 52 is disposed between the porous gel material 40 and the side wall 211, and is into a shape of ring corresponding to the side wall 211, and two-dimensional geometric shapes of the second attach layer 52 and the side wall 211 correspond to each other on the XY plane. Gas is capable of exiting from or entering into the cavity body 20 as shown by arrows in FIG. 1. As shown in FIG. 2, in a second mode of the first embodiment of the invention, both the porous gel material 40 and the first attach layer 51 are into a shape of a layer or a sheet, and correspond to a two-dimensional geometric shape of the base 10 on the XY plane; the second attach layer 52 is disposed between the porous gel material 40 and the side wall 211, and the second attach layer 52 is into a shape of a ring corresponding to the side wall 211, and two-dimensional geometric shapes of the second attach layer 52 and the side wall 211 correspond to each other on the XY plane. Gas is capable of exiting from or entering into the cavity body 20 as shown by arrows in FIG. 2. As shown in FIG. 3, in a third mode of the first embodiment of the invention, the porous gel material 40, the first attach layer 51, and the second attach layer 52 are all into a shape of a ring corresponding to a two-dimensional geometric shape of the side wall 211 on the XY plane. Gas is capable of exiting from or entering into the cavity body 20 as shown by arrows in FIG. 3.

As shown in FIG. 4, in a first mode of the second embodiment of the invention, the porous gel material 40 comprises a first portion 41 and a second portion 42, the first portion 41 is disposed in the inner space 22, the second portion 42 is disposed between the base 10 and the cavity body 20. The first portion 41 includes a first surface 411, the second portion 42 includes a second surface 421, the first surface 411 is covered without exposing to the outside 60, and the second surface 421 is exposed to the outside 60 without covering. In this embodiment, the second portion 42 of the porous gel material 40 is into a shape of a layer or a sheet, and the layer extends from one side to the other side of the side wall 211 of the cavity body 20; the first attach layer 51 is into a shape of a layer or a sheet, and the layer extends from one side to the other side of the side wall 211 of the cavity body 20, in other words, two-dimensional geometric shapes of the second portion 42 of the porous gel material 40 and the first attach layer 51 correspond to each other on the XY plane; the second attach layer 52 is disposed between the second portion 42 of the porous gel material 40 and the side wall 211, and the second attach layer 52 is into a shape of a ring corresponding to the side wall 211, and two-dimensional geometric shapes of the second attach layer 52 and the side wall 211 correspond to each other on the XY plane. In this embodiment, the first surface 411 of the first portion 41 is covered by the side wall 211, the top wall 212, the second attach layer 52 and the second portion 42 without directly communicating with the outside 60, the second surface 421 (i.e., an outer side) of the second portion 42 is not covered, and the first portion 41 and the second portion 42 are connected with each other so that gas is capable of exiting from or entering into the cavity body 20 as shown by arrows in FIG. 4. As shown in FIG. 5, in a second mode of the second embodiment of the invention, both the second portion 42 of the porous gel material 40 and the first attach layer 51 are into a shape of a layer or a sheet, and correspond to a two-dimensional geometric shape of the base 10 on the XY plane; the second attach layer 52 is disposed between the second portion 42 of the porous gel material 40 and the side wall 211, the second attach layer 52 is into a shape of a ring corresponding to the side wall 211, and two-dimensional geometric shapes of the second attach layer 52 and the side wall 211 correspond to each other on the XY plane. Gas is capable of exiting from or entering into the cavity body 20 as shown by arrows in FIG. 5. As shown in FIG. 6, in a third mode of the second embodiment of the invention, the porous gel material 40 is disposed in the inner space 22, and a height h1 of the porous gel material 40 is greater than a height h2 of the side wall 211, so that the porous gel material 40 is formed with the first surface 411 that is covered without exposing to the outside 60, and the second surface 421 is exposed to the outside 60 without covering, and the attach layer 50 is disposed between the porous gel material 40 and the base 10 to fix the porous gel material 40. Gas is capable of exiting from or entering into the cavity body 20 as shown by arrows in FIG. 6.

The invention integrates the porous gel material into the sensor, since gas is capable of entering and exiting between the inner space and the outside, an air pressure between the inner space and the outside can be balanced, and glue spots of an adhesive can be thoroughly set, and the integrity of sensing function can still be met without sacrificing a degree of bonding. In addition, the cavity body can be filled with the porous gel material, so that the cavity body is supportive and not easily damaged, and heat loss in the inner space can be reduced.

What is claimed is:

1. A sensor with a chamber comprising:
   a base;
   a cavity body, disposed on the base and comprising a cavity wall and an inner space formed therein;

a sensing element, disposed on the cavity wall; and a porous gel material, disposed between the base and the cavity body, wherein a porosity of the porous gel material is not less than 80%, and a gas is capable of communicating between the inner space of the cavity body and an outside.

2. The sensor with the chamber according to claim 1, wherein the cavity wall comprises a side wall and a top wall disposed thereon.

3. The sensor with the chamber according to claim 2, further comprising a first attach layer disposed between the base and the porous gel material, and a second attach layer disposed between the porous gel material and the side wall.

4. The sensor with the chamber according to claim 2, wherein the porous gel material is into a shape of a layer extending from a side to the other side of the side wall of the cavity body.

5. The sensor with the chamber according to claim 2, wherein the porous gel material is into a shape of a ring corresponding to the side wall of the cavity body.

6. The sensor with the chamber according to claim 1, wherein the porous gel material comprises a specific surface area between 500 $m^2/g$ and 1200 $m^2/g$, and a density between 0.01 $g/cm^3$ and 0.2 $g/cm^3$.

7. The sensor with the chamber according to claim 1, wherein the porous gel material comprises a silicon-based compound and an additive mixed with the silicon-based compound, and the additive is selected from a group consisting of single-layer carbon nanotubes, multilayer carbon nanotubes, multilayer graphene, and combinations thereof.

8. A sensor with a chamber comprising:

a base;

a cavity body, disposed on the base and comprising a cavity wall and an inner space formed therein;

a sensing element, disposed on a top wall of the cavity body; and a porous gel material disposed between the base and the cavity body, the porous gel material partially disposed in the inner space, the porous gel material comprising a first surface covered by the cavity wall without exposing to an outside, and a second surface exposed to the outside without covering by the cavity wall, wherein a porosity of the porous gel material is not less than 80%, and a gas is capable of communicating between the inner space of the cavity body and the outside through the second surface.

9. The sensor with the chamber according to claim 8, further comprising a first attach layer disposed between the base and the porous gel material.

10. The sensor with the chamber according to claim 8, further comprising a second attach layer disposed between the porous gel material and the side wall.

11. The sensor with the chamber according to claim 8, wherein the porous gel material comprises a specific surface area between 500 $m^2/g$ and 1200 $m^2/g$, and a density between 0.01 $g/cm^3$ and 0.2 $g/cm^3$.

12. The sensor with the chamber according to claim 8, wherein the porous gel material comprises a silicon-based compound and an additive mixed with the silicon-based compound, the additive is selected from a group consisting of single-layer carbon nanotubes, multilayer carbon nanotubes, multilayer graphene, and combinations thereof.

* * * * *